(12) United States Patent  (10) Patent No.: US 8,217,436 B2
Henderson et al.  (45) Date of Patent: Jul. 10, 2012

(54) SINGLE PHOTON AVALANCHE DIODES

(75) Inventors: Robert K. Henderson, Edinburgh (GB); Justin Richardson, Edinburgh (GB)

(73) Assignee: STMicroelectronics (Research & Development) Ltd., Buckinghamshire, Marlow (GB)

( * ) Notice: Subject to any disclaimer, the term of this patent is extended or adjusted under 35 U.S.C. 154(b) by 317 days.

(21) Appl. No.: 12/498,874

(22) Filed: Jul. 7, 2009

(65) Prior Publication Data

US 2010/0019295 A1   Jan. 28, 2010

(30) Foreign Application Priority Data

Jul. 10, 2008 (EP) ................................. 08275029

(51) Int. Cl.
*H01L 31/062* (2006.01)
(52) U.S. Cl. ................. 257/292; 257/605; 257/E29.335
(58) Field of Classification Search .................. 257/292, 257/605, E29.335
See application file for complete search history.

(56) References Cited

U.S. PATENT DOCUMENTS

| | | |
|---|---|---|
| 2002/0024058 A1 | 2/2002 | Marshall et al. |
| 2005/0255625 A1 * | 11/2005 | Janesick et al. ................. 438/57 |
| 2006/0192086 A1 | 8/2006 | Niclass et al. |
| 2007/0028205 A1 * | 2/2007 | Nakano et al. .................. 716/19 |

FOREIGN PATENT DOCUMENTS

| | | |
|---|---|---|
| WO | WO-03067663 A1 | 8/2003 |
| WO | 2007127607 A1 | 11/2007 |
| WO | WO-2008011617 A2 | 1/2008 |

OTHER PUBLICATIONS

Rochas et al. Single photon detector fabricated in a compelentary metal-oxide-semicondcutor high-voltage technology, Jul. 2003, Review of Scientific instrucments vol. 74, No. 7, pp. 3263-3270.*
EP Search Report cited in Application No. EP08275029, dated Jan. 6, 2009 (4 Pages).
EP Supplemental Search Report cited in Application No. EP08275029, dated Aug. 19, 2009 (4 Pages).

* cited by examiner

*Primary Examiner* — Ha Tran T Nguyen
*Assistant Examiner* — Shaun Campbell
(74) *Attorney, Agent, or Firm* — Gardere Wynne Sewell LLP

(57) ABSTRACT

A CMOS single photon avalanche diode (SPAD) design uses conventional, or at least known, CMOS processes to produce a device having a breakdown region in which the main p-n junction is formed of a deep n-well layer, and optionally on the other side, a p-add layer. The SPAD may also have a guard ring region which comprises the p-epi layer without any implant. The SPAD may have curved or circular perimeters. A CMOS chip comprises SPADs as described and other NMOS devices all sharing the same deep n-well.

32 Claims, 6 Drawing Sheets

SINGLE PHOTON AVALANCHE DIODES

PRIORITY CLAIM

The present application claims the benefit of European Application for Patent No. 08275029 filed Jul. 10, 2008 entitled "Improvements in Single Photon Avalanche Diodes", the disclosure of which is hereby incorporated by reference to the maximum extent allowable by law.

BACKGROUND OF THE INVENTION

1. Technical Field of the Invention

The present invention relates to avalanche photodiodes.

2. Description of Related Art

The avalanche process in solid-state devices has been known for at least fifty years, as has its application to photomultiplication. An avalanche is triggered when reverse biasing a PN-junction to around the breakdown voltage. This effect can be used in two modes of operation. Commonly, the avalanche photodiodes are biased just below the breakdown voltage, with the photocurrent remaining being proportional to the incoming light intensity. Gain values of a few hundreds are obtained in III-V semiconductors as well as in silicon. This mode of operation has been extensively studied in the literature.

Alternatively, to detect very weak light intensities, the photodiode can be biased above the breakdown voltage in the so-called "Geiger" mode. This mode of operation requires the introduction of a quenching mechanism to stop the avalanche process. Each incoming photon results in a strong current pulse of few nanoseconds duration. The device works as an optical Geiger counter. In this mode of operation the device is known as Single Photon Avalanche Diode (SPAD).

An important technological problem has been to avoid the breakdown at the edge of the p/n junction. In group III-V materials as well as in silicon, specific technologies have been developed for diode fabrication. Usually, a guard ring is introduced to prevent the edge breakdown. These specific steps however are not included in standard CMOS technologies and silicon-SPADs have required costly hybrid electronics.

Single photon counting devices have only recently been successfully integrated in CMOS technologies opening the way to non-PMT based fully solid-state single photon sensing devices.

There are a number of SPAD device structures which can be formed in standard CMOS. The most critical aspect of their construction is the formation of a guard ring to prevent premature edge breakdown. This guard ring is usually made of p-well material, although shallow trench isolation (STI) techniques have also been used. The other type of structure is the "enhancement" or "virtual guard ring" structure.

Such SPADs are sensitive at short wavelengths, which is largely due to the use of shallow source-drain implants to form the avalanche region. SPADs have been created in a variety of CMOS linewidths from 0.8 µm to 0.13 µm. Process variants such as SOI, high voltage and BiCMOS process variants have been employed, making use of additional wells and implants to create suitable guard ring structures and avalanche breakdown regions.

SPADs integrated in 0.8 µm CMOS process in 2000 and more recently in 0.35 µm have shown good photon detection efficiency (PDP) and low dark count, in the region of tens of Hz at room temperature. Diameters of these devices typically range from 5-20 µm. Research is ongoing in the formation of SPADs in 180 nm and 130 nm where a number of groups have presented results. However, the dark count is in the tens of kHz to MHz range rendering these devices of less interest for the majority of photon-starved applications requiring low noise. The dark count mechanism has switched to tunneling in CMOS technologies from the 0.18-µm node onwards. The high doping concentration levels cause a very narrow depletion region resulting in a significant number of tunneling-induced carriers and increased dark count.

In particular, the doping levels of the n-well and p+ (p-diffusion) forming the avalanche breakdown p-n junction are excessively high. Such junctions and wells are required for reasons of efficient PMOS transistor formation in scaled CMOS technologies. However, they are contrary to the requirements for avalanche photodiode operation.

There is therefore no obvious method to form a low-noise SPAD in standard CMOS technologies from the 0.25-µm node onwards as all the known constructions (see, FIG. 1) employ the p+ to n-well junction. Other junctions have been employed recently requiring a specialized high-voltage 0.35-µm CMOS technology with low doped n-well regions.

CMOS processes at the 0.25-µm node and beyond employ shallow trench isolation (STI) which is required to isolate transistors from each other. STI is formed by etching shallow trenches in the semiconductor wafer which are then filled with $SiO_2$ to form insulating walls between devices. However the process is known to induce stress and induce leakage currents in photodiodes or dark count in SPADs. The potential benefit of STI is the ability to integrate devices more densely while still providing a degree of optical and electrical isolation.

A number of SPAD structures have been proposed which employ the STI region as a guard ring. By not requiring a periphery of a lower doped material these structures reduce the width of the lateral depletion region and permit higher fill-factor and active area. However, these devices are affected by higher dark count induced by stress and defects at the STI boundary. In a recently proposed SPAD structure a p-type implant is used to surround the STI to passivate traps and defects resulting in a lower dark count. However these devices are still affected by tunneling in the p-diffusion n-well breakdown region resulting in a high overall noise level.

A structure has also been proposed to distance the STI from the p-plus breakdown region by introducing a poly over active (thin-oxide) periphery to the SPAD. Within the proposed device the guard ring is formed from p-well which is bounded by STI coincident with the poly/active edge. Although functional as a guard ring, tunneling in the p-plus/n-well breakdown region prevents the full-benefit of this guard ring structure from being realized.

Another feature of CMOS process generations beyond 0.25-µm is the presence of a deep n-well implant formed by high-energy ion implantation step before n-well formation. Deep n-well contacted by a ring of n-well is used to completely enclose p-well regions in order to isolate NMOS transistors from the remainder of the substrate. The resulting twin-well process has become an industry standard in recent years to obviate increasing noise-coupling issues in nanometer scale process generations.

Consequently, it would be advantageous to be able to produce a sub-0.25-µm CMOS SPAD with low dark-count characteristics that can be manufactured using existing CMOS manufacturing processes (whether common or field specific), without the need for any special or unique implants, which would add considerable cost and complexity.

SUMMARY

In a first aspect there is provided a CMOS single photon avalanche diode having a breakdown region and a guard ring region, both formed in the epitaxial layer of a substrate, wherein said breakdown region comprises a main p-n junction that is comprised on a first side from a deep well implant having a doping concentration lower than that of conventional shallower well implants of the same type.

In the above, same type means n or p type, as in n-well or p-well.

Using said deep well implant in this way causes said main p-n junction depletion region to extend deeper in the breakdown region than in conventional devices.

Said diode may comprise only standard implants from CMOS design rules, and in particular sub 0.25 micron CMOS design rules. The implants considered standard are n+ and p+ diffusions for source drain formation of NMOS or PMOS transistors respectively (referred to henceforth as n+ or p+), n-well and p-well implants for formation of PMOS and NMOS transistor bulks respectively and deep n-well implant for isolation of areas of p-well in NMOS transistor bulk formation. This refers to a p-substrate epitaxial CMOS process and can be reversed for a n-substrate epitaxial CMOS process. Areas of shallow trench isolation (STI) may also be present formed in areas outside active transistor definition.

Said diode may comprise said deep well implant without a conventional shallower well implant of the same type, within the breakdown region. In one embodiment said breakdown region comprises no conventional n-well or p-well implant. One or more conventional shallower well implants (p-well/p+ or n-well/n+) may be used in providing good ohmic contact to a physical connector, for either or both anode and cathode, however.

Said deep well implant may be a retrograde well, having a vertically graded dopant concentration, throughout the breakdown region, that is lowest at the substrate surface and highest at the bottom of the well. Said guard ring may be formed in said retrograde well without any further implant. Preferably said guard ring region is formed in the upper (shallow), lower doped region of said retrograde well.

Said second side may be the cathode side. Said anode side of said p-n junction may be formed from a further implant having a doping concentration lower than a p+ or n+ implant, as appropriate. However, a thin p+ or n+ implant, as appropriate, may also be provided in combination with this further implant to provide a good ohmic connection to a physical anode connector. Said further implant may comprise a conventional n or p-well implant. Alternatively, said further implant may comprise an implant type that is lower doped than a conventional n or p-well implant, such as that conventionally used in CMOS imaging processes, for example around shallow trench isolation for passivation purposes. As a further alternative, said main p-n junction may be formed above said deep well implant, in said breakdown region, said breakdown region comprising two implants that at least partially overlap, each of opposite type. In this alternative, one of these two implants that at least partially overlap is a conventional shallower well implant of the same type than that of said deep well implant, and the other is an implant type that is lower doped than a conventional n or p-well implant, such as that used in CMOS imaging processes, for example, around shallow trench isolation for passivation purposes.

Said deep well implant may be an n-type deep well implant, conventionally used for isolation purposes, implanted in a p-substrate.

In a further aspect there is provided a CMOS single photon avalanche diode having a breakdown region and a guard ring region, wherein said guard ring region is comprised, at least partially, from the epitaxial layer or substrate without any shallow implant.

Said diode may comprise a retrograde deep well implant, having a vertically graded dopant concentration throughout the guard ring region. Said guard ring may be formed in said retrograde well without any further implant. Preferably said guard ring region is formed in the upper (shallow), lower doped region of said retrograde well. Said breakdown region may comprise a main p-n junction that is comprised on a first side from said deep well implant, said deep well implant having a doping concentration lower than that of conventional well implants of the same type.

Said diode may form part of a chip in which said first deep well is shared by other devices as well as the diode, wherein the breakdown voltage of said main p-n junction is arranged to be lower in magnitude than any other p-n junctions formed in the diode and in, or as a result of, the devices sharing said first deep well.

It should be noted that the optional statements above, applicable to the first aspect, may be equally applicable to this aspect.

In a yet further aspect there is provided a CMOS chip comprising a single photon avalanche diode and one or more other devices, said diode comprising a main p-n junction and a deep well implant, said deep well implant being shared by at least some of said at least one or more other devices, wherein the breakdown voltage of said main p-n junction is arranged to be lower in magnitude than any other p-n junctions formed in the diode and in, or as a result of, said at least some of said at least one or more other devices which share said first deep well.

Again, where appropriate, said optional features relating to the first aspect could equally conceivably, be used with the designs of the two aspects immediately above.

In another aspect there is provided a CMOS single photon avalanche diode having a breakdown region and a guard ring region, both formed in the epitaxial layer of a substrate, wherein said breakdown region comprises an implant type that is lower doped than a conventional n or p-well implant, said implant type being known from CMOS imaging processes.

In another aspect there is provided a CMOS single photon avalanche diode comprising a plurality of implants, wherein said single photon avalanche diode, and some or all of said implants are comprised of a shape of which at least some of its perimeter is substantially curved.

In one embodiment said single photon avalanche diode and said some or all of said implants are substantially circular in shape. Alternatively, said single photon avalanche diode and said some or all of said implants may be approximately rectangular in shape, said approximately rectangular shape having substantially curved corners. Said curved corners may have a suitably large radius so as to maximize fill factor whilst maintaining an on-grid, non-conic design.

Substantially curved and substantially circular may mean being formed by a succession of vertical and horizontal lines, each of which having a length that is very short in comparison to the perimeter length of the resultant shape.

The application also covers devices including SPADS and chips according to all the above aspects, including (but not being limited to): advanced medical devices (such as PET/SPECT/OCT), Bio-imaging (such as FLIM/high frame rate microscopy), machine vision (such as LIDAR/range finding/precision optical inspection) and high bandwith optical data transmission.

BRIEF DESCRIPTION OF THE DRAWINGS

Embodiments will now be described, by way of example only, by reference to the accompanying drawings, in which.

DETAILED DESCRIPTION OF THE DRAWINGS

Figure 1:
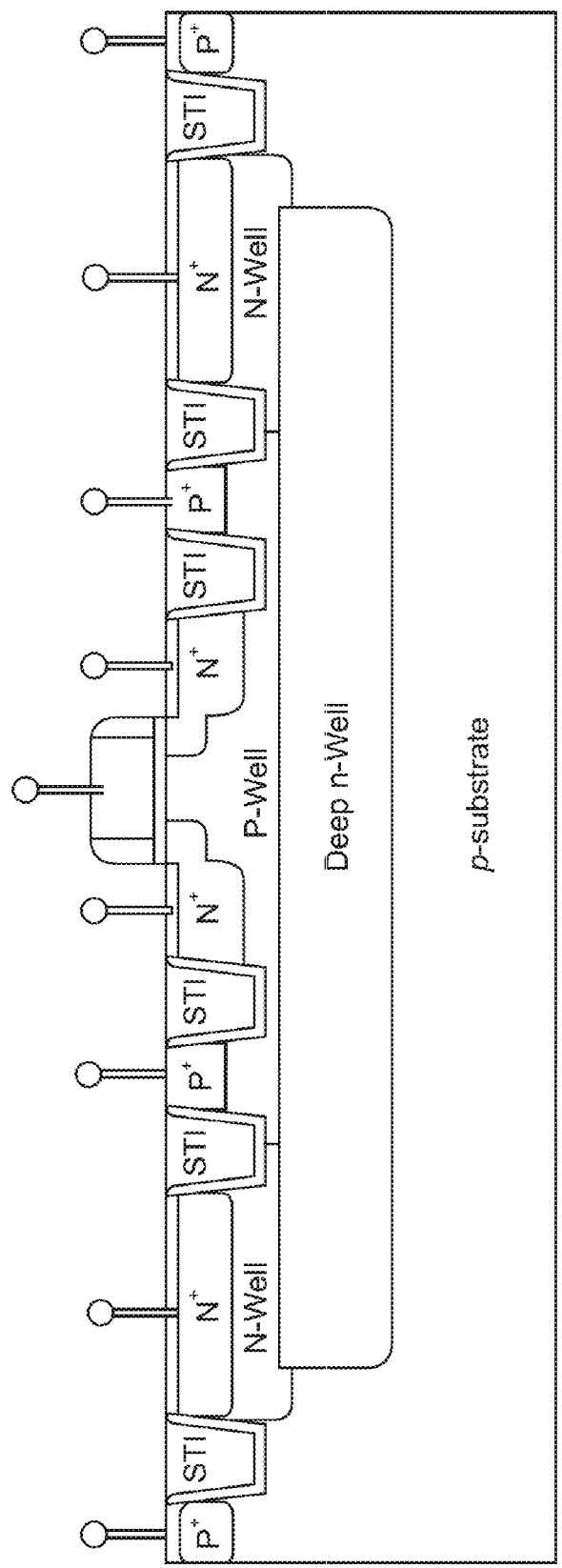
FIG. 1 illustrates the standard layers for formation of an NMOS transistor in an isolated p-well in a typical deep-submicron CMOS process.

FIG. 1 shows the standard layers for formation of an NMOS transistor in an isolated p-well in a typical deep-submicron CMOS process. It shows a number of "layers" formed into a p-substrate. The skilled person in conventional CMOS device design and manufacturing will further recognize each of the layer types as those used in conventional CMOS design and manufacture, and especially in deep-submicron or nanometer era CMOS technologies, where there is a twin well option.

While there are no real "standard" design rules as such, the exact spacings and dimensions relating to a particular manufacturer, the disposition and ordering of layers is common across process technologies of different manufacturers. As a consequence, the skilled person will recognize the standard implants (STI, n-well, p-well, n+, p+, poly (thin oxide), deep/buried n-well (otherwise known as n-iso)) and the use of layers. The operation of this transistor will be readily apparent to the skilled person and will not be described here.

It is highly desirable that any SPADs are manufacturable using existing CMOS processes, either in "standard" form, or possibly in existing specialized forms, such as in CMOS imaging processes.

Figure 2:
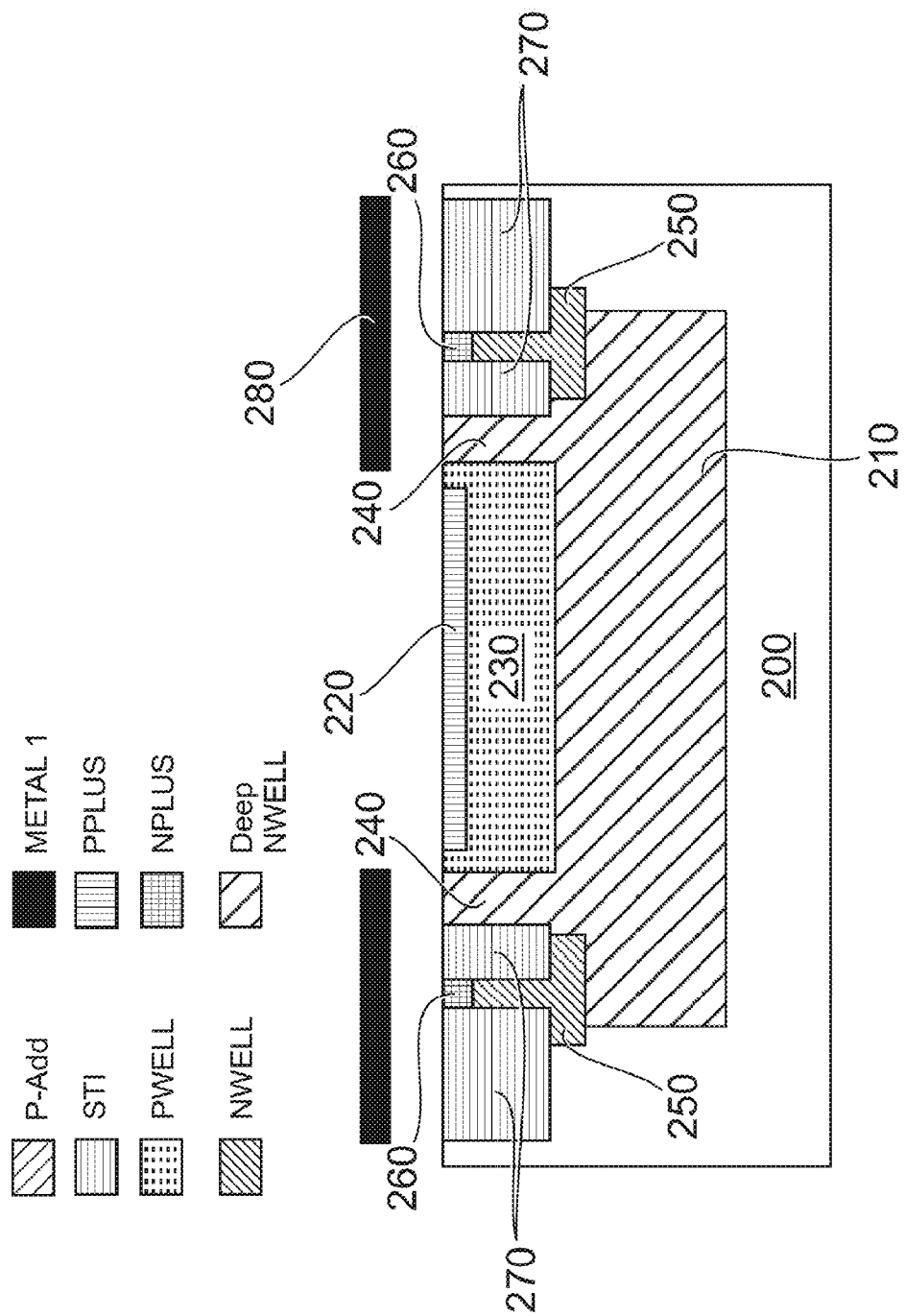
FIG. 2 shows a cross-section of a single photon avalanche diode according to a first embodiment.

FIG. 2 shows a cross-section of a single photon avalanche diode (SPAD). The base for all the implants is the lightly doped p-epi(taxial) 200 layer (although the skilled person will realize, as with all the devices disclosed herein, that n-substrate/n-epi can be used, with all other region doping reversed (p to n and vice versa)), which is usually only a few Mm thick, and deposited on a substrate (not shown). The deepest layer, or implant, is a deep (or buried) n-well layer 210, which forms the cathode of the device. The anode is comprised of a layer of p+ 220 material in a p-well 230, while the guard ring 240 is formed only by the lightly doped p-epi layer. To provide good ohmic contact to the cathode there is provided regions of n-well 250 and n+ 260. Regions of STI 270 are provided to isolate this device from others on the same wafer. Also shown is the first metal layer 280.

To understand how this design operates, it must be realized the each layer does not represent a region of even doping. In particular, the deep n-well implant 210 is a "retrograde well" which comprises a doped region with a vertically graded dopant concentration that is lowest at the substrate surface, and highest at the bottom of the well. In the present case, formation of the deep n-well layer causes a grading effect of "n-doping" through the whole substrate vertically above the well. In conventional CMOS design, this effect can be ignored as it is convention to locate an n-well directly above, thus implanting further "n-type" ions into this region anyway, and removing this grading. This is because the deep n-well layer was conceived, and tip to now, used solely for isolation of wells from adjacent electronics for noise reduction or protection. Consequently, this convention is so ingrained that producing a design without a normal n-well above a deep n-well causes most CMOS design software to indicate an error.

In conventional SPADs, the p-n junction is formed from p+ material in an n-well. However the high doping concentration of p+ and n-well (required for its main use in transistor operation) results in a thin depletion region at the junction. The thin depletion region means that carriers often cross the depletion region, an event indistinguishable from that of the arrival of a photon. This is known as "dark count", as these counts are measured in the absence of photons/light.

The device of FIG. 2 has a reduced dark count rate primarily because its p-n junction is formed by two lighter doped layers, and extends deeper into the device, thus causing the depletion region to increase. The p-n junction in this example is formed by the p-well and deep n-well layer. In this regard it should be noted that a p-well is less heavily doped than p+ and deep n-well is less heavily doped than conventional n-well. Furthermore, the p-well (in conjunction with the progressive deep n-well) provides a progressively graded junction into the n-type region, this in itself being graded, thus also causing the depletion region width to increase.

A major issue in SPAD designs is represented by edge effects in the p-n junction, where high electric field can produce premature breakdown and therefore prevent the device to operate in "Geiger mode". In order to reduce edge effects, guard rings of low-doping diffusions are conventionally employed. The purpose of the diffusion is the reduction of the electric field below the values reached in the planar multiplication region.

In the present design the guard ring is formed simply by the p-epi, which due to the deep n-well implantation process (performed throughout the full area of the device, including the guard ring area), has graded "n-doping" through it, lowering its overall doping level (that is cancelling out its own "p-doping") and therefore resulting in a good low field region, which reduces any edge-effects. Consequently this guard ring area is formed in the upper (shallower) region of the retrograde deep n-well.

Overall, the above design can be manufactured using conventional (<0.25 nm$^2$ CMOS manufacturing techniques, which in itself is very important in keeping costs viable, while producing a very small (<0.25 nm$^2$) SPAD with very low dark count level, that is some orders of magnitude less than conventional designs of similar size. At the same time it also meets other parameter targets, such as having a photon detection efficiency exceeding 30% at an excess bias voltage level of approximately IV, to ensure its viability and usefulness.

Figure 3:
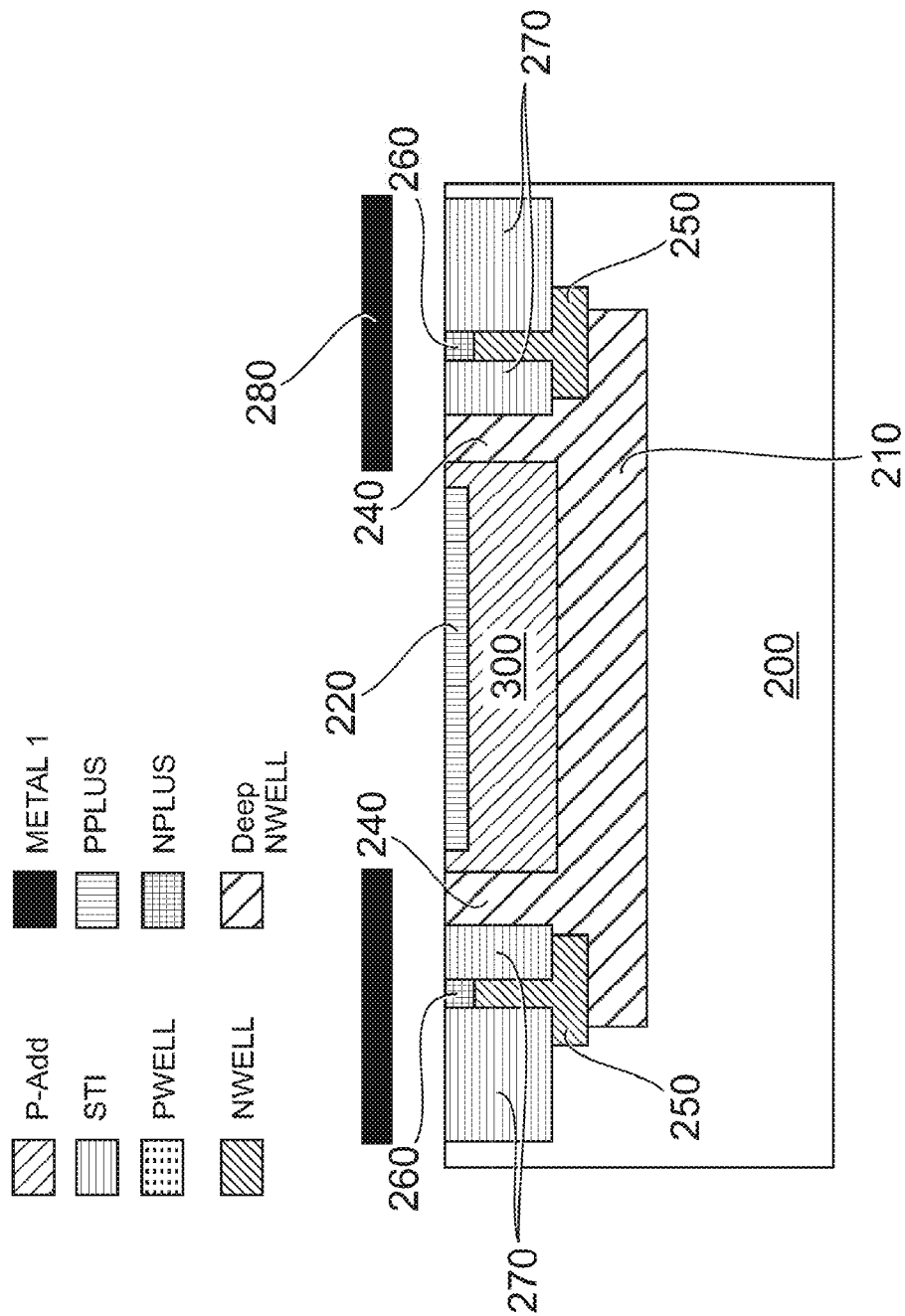
FIG. 3 shows a cross-section of a single photon avalanche diode according to a second embodiment.

FIG. 3 shows a similar, but potentially improved (at least in terms of dark count rate) device to that of FIG. 2. The only difference is that the conventional p-well has been replaced with a lower-doped p-well layer, p-add 300 which, while not necessarily being conventional in the wider CMOS sense, is a layer type well known to the skilled person in CMOS imaging device processes (for example the IMG175 CMOS imaging process pioneered by the present applicant). It should be noted that use of this p-add implant will require an extra mask and fabrication step. This lower doped p-well implant, p-add 300 forms a progressively graded junction into the n-type region, while again the N donor region is graded back up towards the anode by using the "deep n-well" implant without a conventional n-well.

As the p-add implant used in this embodiment is lower doped than the p-well layer of FIG. 2 (and is much lower doped and deeper than a conventional p+ implant), the depletion region is correspondingly larger and dark count lower, so low in fact that it is in the region of 30 Hz, which is a couple of orders of magnitude lower than the example of FIG. 2 and therefore many orders of magnitude lower than the corresponding prior art. At the same time, other parameters are within acceptable limits, such that the device is practical in use.

Figure 4:
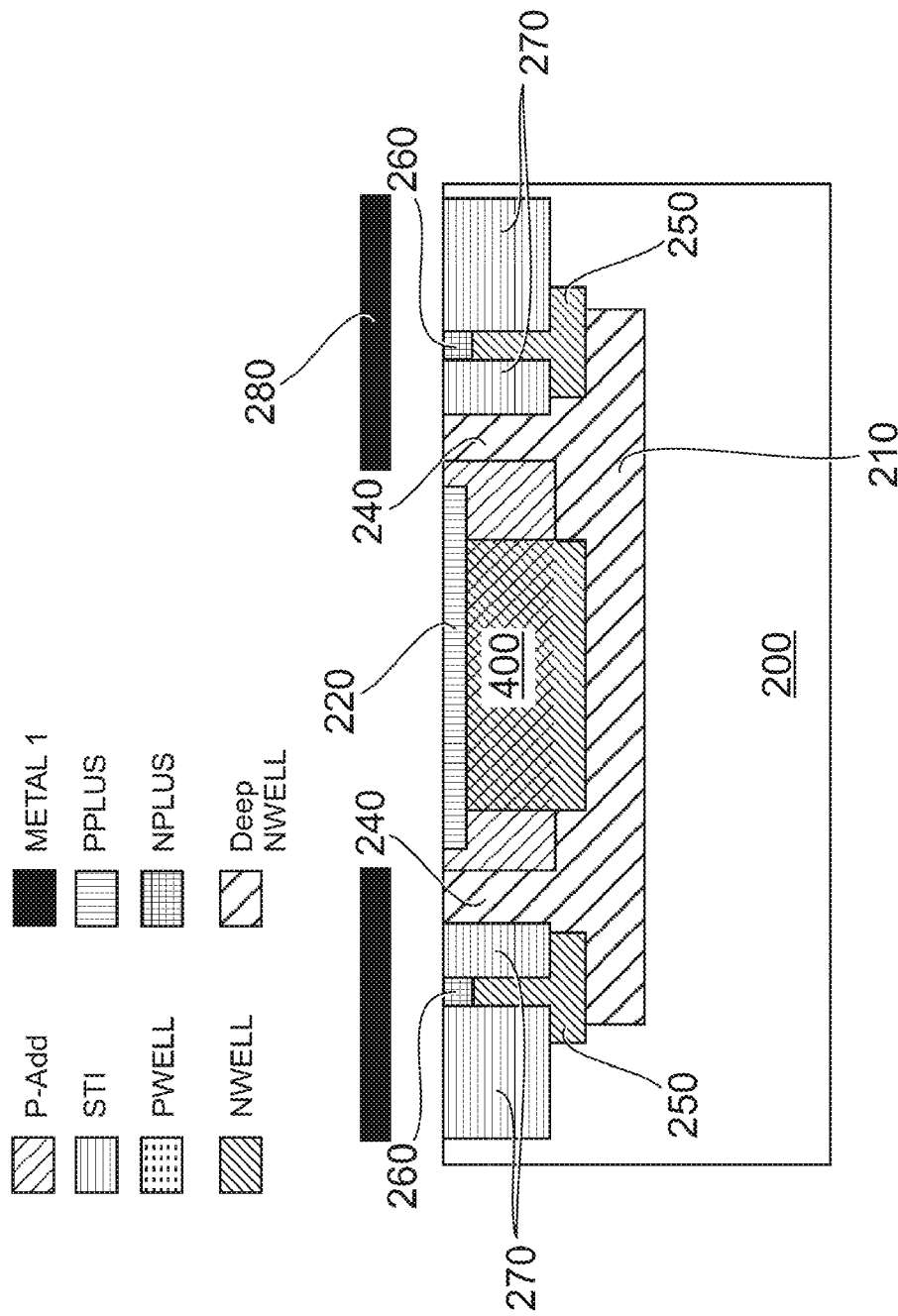
FIG. 4 shows a cross-section of a single photon avalanche diode according to a third embodiment.

FIG. 4 shows a further SPAD design. This design differs from having above the deep n-well implant, a breakdown region formed from both an n-well implant 250, and an implant of p-add 300, the lower doped p material used in the breakdown region of the SPAD of FIG. 3. The effect of this p-add implant (which is implanted after the n-well) is to create a graded breakdown region 400 (due to the progressive deep n-well 210), which therefore has a deeper and wider depletion region extending into the n-well 250. This again results in a very low dark count (approximately 30 Hz).

Another difference is that the guard ring is partially formed the lower doped p-implant, although the outer periphery of the guard ring is formed from the deep n-well graded p-epi layer as in the other examples above. This means the guard ring has an inner region that is higher doped (though still relatively low doped) than its outer region. Therefore, again there is provided a low field guard ring, but in this case with a field that decreases from its inside to its periphery.

One particular advantage of this arrangement is that, not only is the dark current leakage very low, but so is the breakdown voltage (−12.6 v). This, in turn, means that the deep n-well can be shared with other devices, as this breakdown voltage is less than the breakdown voltage of the deep n-well and p-substrate junction and of a p-well and deep n-well junction. Therefore one or more p-wells can also be formed in the deep n-well, without risk of the consequent p-n junction breaking down due to the −12.6V required for the SPAD to operate.

Figure 5:
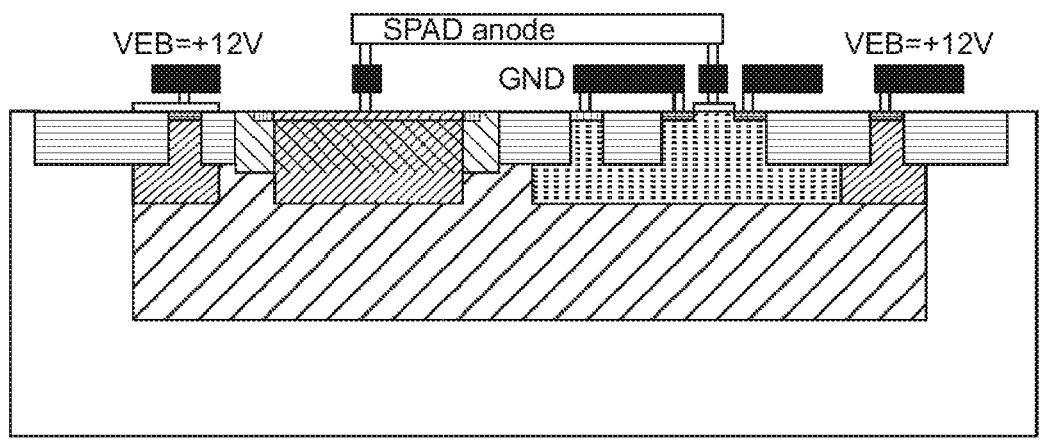
FIG. 5 shows such an integrated devices showing the single photon avalanche diode of FIG. 4 and an NMOS transistor sharing the same deep n-well and substrate.

FIG. 5 shows such an integrated device (unlabelled for clarity, each implant corresponding to the appropriate implants of FIGS. 2 to 4), showing a SPAD and NMOS transistor sharing the same deep n-well and substrate. The SPAD is the same as depicted in FIG. 4, and the NMOS transistor is conventional and its structure and operation, which will be immediately apparent to the skilled person without further description here. The NMOS devices are formed in p-well regions within the deep n-well. These NMOS devices may be connected in such a way as to perform quenching and readout operations on a SPAD, that is the anode of a SPAD may be connected to the drain AND/OR gate of an NMOS device or devices to perform quenching or readout. An array of SPADs and NMOS transistors can be formed in the same deep well, thereby forming an addressable imaging array. While the SPAD of FIG. 4 is shown here, it will be appreciated that any of other SPAD could be used, provided that its breakdown voltage is lower than that of any other p-n junctions on the device.

Figure 6A:
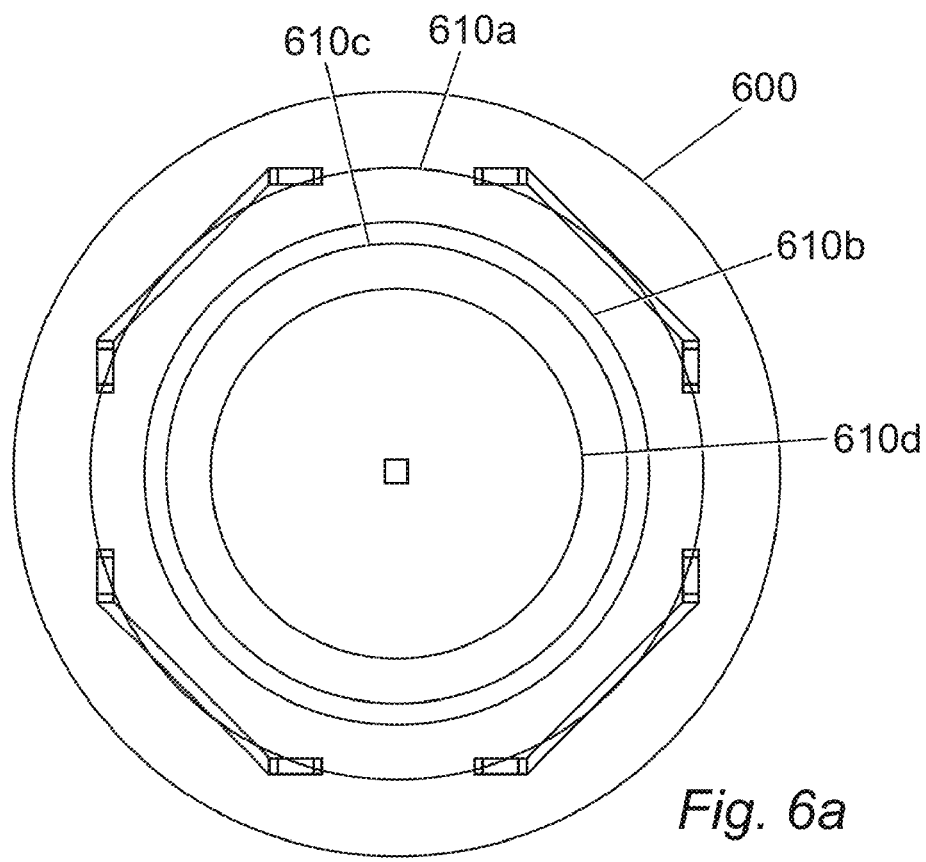
FIG. 6a shows the single photon avalanche diode of FIG. 1 from above.
Figure 6B:
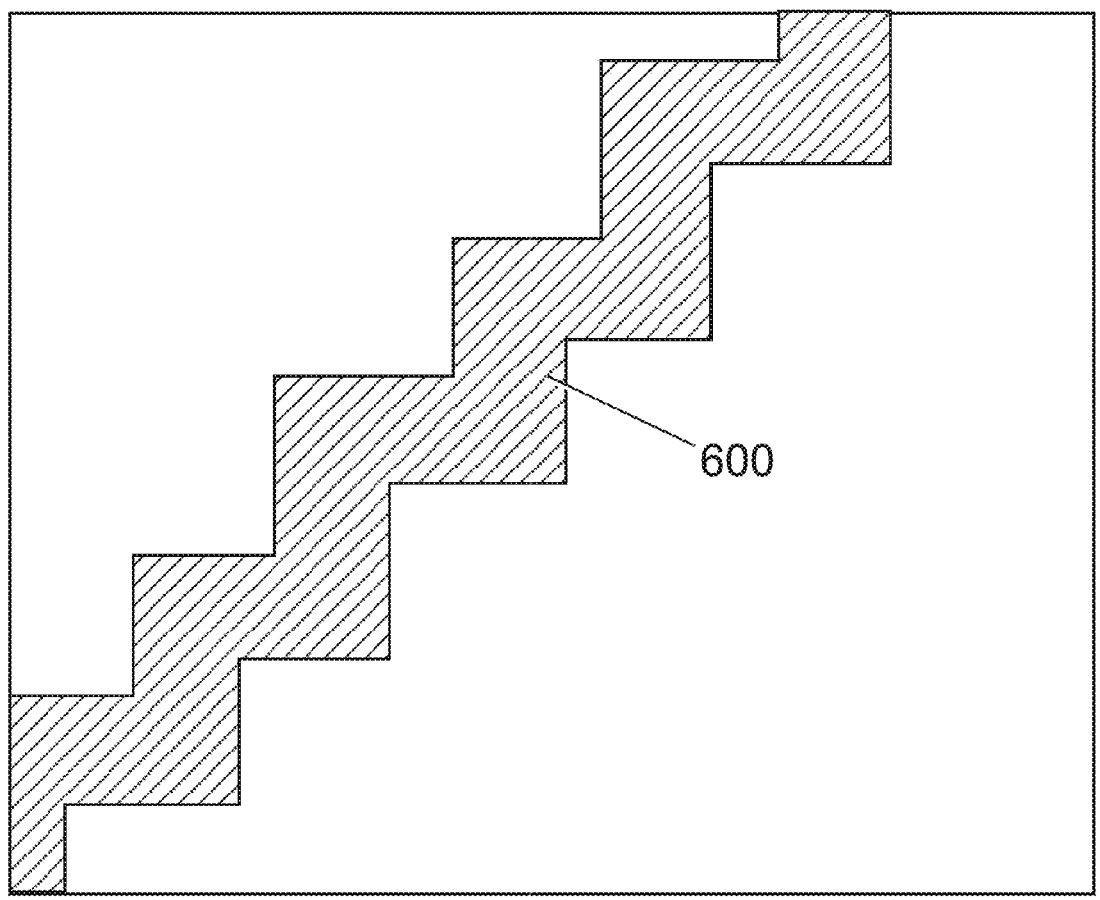
FIG. 6b shows a close up of FIG. 6a, showing the perimeter of the SPAD.

FIGS. 6A and 6B show the SPAD of FIG. 2 from above. It can be seen that the shape of the SPAD 600, and the main implants/wells 610a, 610b, 610c, 610d are all substantially round. This is advantageous in SPAD design, in particular in reducing breakdown homogeneity, due to relatively high field areas being formed at the periphery of non-circular SPADs, particularly at the vertices of conventional octagonal designs. However, such designs break the CMOS design rules and accepted practice, insofar as CMOS design software will only allow devices and implants of shapes with angles of either 45 or 90 degrees. In this case the inventors have got around these rules by forming the circular shapes out of a plurality of very short horizontal and vertical lines (each around 0.1 μm long). This can be clearly seen from the detail of FIG. 6b. Obviously, any of the designs disclosed herein (as well as any other CMOS SPAD) may be designed in this way.

An alternative to the SPAD of FIG. 6, which also achieves many of the same advantages while maximizing the active area, is a SPAD of rectangular or square design, but with rounded corners made the same way as that detailed in FIG. 6b.

The above SPADs have many uses which include the following:

1. Cell Imaging, including Flow Cytometry, Confocal Microscopy, Microarray Scanning, High Throughput Screening (HTS), FLIM (Fluorescence Lifetime Measurement), TRF (Time Resolved Fluorescence), FRET (Fluorescence Resonance Energy Transfer), FCS (Fluorescence Correlation Spectroscopy), TCSPC (Time Correlated Single Photon Counting), Spectrometry, Raman Spectrometry, HPLC—Liquid Chromatography;

2. Biodiagnostics, including Protein Sequencing, DNA Sequencing, Gene Sequencing, Capillary Electrophoresis, Chemiluminescence, Nitric Oxide Detection, Breath Monitoring, Water/Environment/Air Monitoring;

3. Inspection, including Food Sorting, Particle Sizing, Semiconductor Inspection, Radiation Detection, Radiation Monitoring, Nuclear Medicine (PET/SPECT), High Energy Particle Detection, X Ray Detection;

4. Telecoms, including Quantum Cryptography, Quantum Systems, Point to Point Communications, Active Imaging;

5. LIDAR, including Range Finding, 3D Camera, 3D Surveying (of Buildings/Structures), Adaptive Optics, Geo Survey Systems, Sub-terrain Survey Systems, Imaging;

6. Night/Security Imaging, including ODT/OCT (Optical Diffuse/Coherence, Tomography), Homeland Security, 7. X-Ray Detection, including Chemical, Nuclear and Biological Detection, Airport Personnel and Luggage Security scanning, Imaging and surveillance;

8. PET scanners (and in particular silicon photomultipliers therefor); and

9. Human-computer interfaces, including Face recognition, Gesture recognition, 3D input for games consoles, and optical mice.

It should be appreciated that the above description is for illustration only and other embodiments and variations may be envisaged without departing from the spirit and scope of the invention. For example, other structures may be envisaged that use standard CMOS implants (or at least the conventional implants available for more specific CMOS technologies, for example imaging), yet use at least one lower doped implant than used in conventional SPADs to form one side of the p-n junction, so as to widen the depletion layer. Also, all the devices have been described in relation to their formation in p-epi, but may equally be formed in n-epi, with opposite doping for all the implants, as appropriate.

Although preferred embodiments of the method and apparatus have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A CMOS single photon avalanche diode having a breakdown region and a guard ring region, both formed in an epitaxial layer of a substrate, wherein said breakdown region comprises a main p-n junction comprised of a deep well implant forming a retrograde well having a vertically graded dopant concentration, said vertically graded dopant concentration being highest at a bottom of the retrograde well and lowest at a surface of the epitaxial layer, and wherein said guard ring region is formed solely by a portion of said retrograde well without further dopant implant.

2. The CMOS single photon avalanche diode of claim 1, wherein said guard ring is formed in an upper shallow portion of the retrograde well.

3. The CMOS single photon avalanche diode of claim 1, wherein said deep well implant of the main p-n junction forms a cathode.

4. The CMOS single photon avalanche diode of claim 1, wherein said breakdown region does not include an overlying shallow well implant of a same dopant type as said deep well implant.

5. The CMOS single photon avalanche diode of claim 1, wherein said p-n junction is further comprised of another implant directly overlying the deep well implant, wherein said another implant has a dopant concentration that is lower than a p+ or n+ type implant.

6. The CMOS single photon avalanche diode of claim 5, further comprising a further implant, of a same dopant type as said another implant, said further implant directly overlying said another implant and having a dopant concentration that is a p+ or n+ type implant.

7. The CMOS single photon avalanche diode of claim 6, wherein said another implant forms an anode.

8. The CMOS single photon avalanche diode of claim 1, wherein said single photon avalanche diode and at least some implants used to form the diode are comprised of a shape wherein at least some portion of said shape's perimeter is substantially curved.

9. The CMOS single photon avalanche diode of claim 8, wherein said single photon avalanche diode and said some or all of said implants are substantially circular in shape.

10. The CMOS single photon avalanche diode of claim 9, wherein substantially circular comprises a circle formed by a succession of alternating vertical and horizontal edges.

11. The CMOS single photon avalanche diode of claim 1, wherein said single photon avalanche diode and at least some implants used to form the diode are approximately rectangular in shape, said approximately rectangular shape having substantially curved corners.

12. The CMOS single photon avalanche diode of claim 11, wherein said curved corners has a suitably large radius so as to maximize fill factor whilst maintaining an on-grid, non-conic design.

13. The CMOS single photon avalanche diode of claim 11, wherein substantially curved comprises a curve formed by a succession of alternating vertical and horizontal edges.

14. A CMOS single photon avalanche diode having a breakdown region and a guard ring region, both formed in an epitaxial layer of a substrate, comprising a deep well implant of a first conductivity type forming a retrograde well having a vertically graded dopant concentration and wherein said breakdown region comprises a main p-n junction comprised of a buried region of a same conductivity type as the retrograde well which is formed within the retrograde well and an additional implant in the retrograde well of a second conductivity type which directly overlies the buried region, said vertically graded dopant concentration being highest at a bottom of the retrograde well and lowest at a surface of the epitaxial layer, and wherein said guard ring region comprises a first portion formed by the additional implant in the retrograde well of the second conductivity type and a second portion surrounding the first portion which is formed solely by a portion of said retrograde well without further dopant implant.

15. The CMOS single photon avalanche diode of claim 14, wherein said second portion of the guard ring is formed in an upper shallow portion of the retrograde well.

16. The CMOS single photon avalanche diode of claim 14, wherein said deep well implant of forms a cathode.

17. The CMOS single photon avalanche diode of claim 14, wherein said additional implant in the retrograde well has a dopant concentration that is lower than a p+ or n+ type implant.

18. The CMOS single photon avalanche diode of claim 17, further comprising a further implant, of a same dopant type as said additional implant, said further implant directly overlying said additional implant and having a dopant concentration that is a p+ or n+ type implant.

19. The CMOS single photon avalanche diode of claim 18, wherein said additional implant forms an anode.

20. The CMOS single photon avalanche diode of claim 14, wherein said single photon avalanche diode and at least some implants used to form the diode are comprised of a shape wherein at least some portion of said shape's perimeter is substantially curved.

21. The CMOS single photon avalanche diode of claim 20, wherein said single photon avalanche diode and said some or all of said implants are substantially circular in shape.

22. The CMOS single photon avalanche diode of claim 21, wherein substantially circular comprises a circle formed by a succession of alternating vertical and horizontal edges.

23. The CMOS single photon avalanche diode of claim 14, wherein said single photon avalanche diode and at least some implants used to form the diode are approximately rectangular in shape, said approximately rectangular shape having substantially curved corners.

24. The CMOS single photon avalanche diode of claim 23, wherein said curved corners has a suitably large radius so as to maximize fill factor whilst maintaining an on-grid, non-conic design.

25. The CMOS single photon avalanche diode of claim 23, wherein substantially curved comprises a curve formed by a succession of alternating vertical and horizontal edges.

26. A CMOS single photon avalanche diode, comprising:
   a deep well implant of a first conductivity type in an epitaxial layer forming a retrograde well having a vertically graded dopant concentration, said vertically graded dopant concentration being highest at a bottom of the retrograde well and lowest at a surface of the epitaxial layer;
   a shallower well implant of a second conductivity type formed in the retrograde well to produce a breakdown region comprising a p-n junction, said shallow well implant having a peripheral edge; and
   a guard ring formed by a portion of said retrograde well adjacent to the peripheral edge of the shallow well implant without further dopant implant in the retrograde well.

27. The CMOS single photon avalanche diode of claim 26, wherein said guard ring is formed in an upper shallow portion of the retrograde well.

28. The CMOS single photon avalanche diode of claim 26, wherein said deep well implant of the p-n junction forms a cathode.

29. The CMOS single photon avalanche diode of claim 26, wherein said shallower well implant of a second conductivity type is directly overlying the retrograde well.

30. The CMOS single photon avalanche diode of claim 26, further comprising an intermediate implant between the shallower well implant and the retrograde well.

31. The CMOS single photon avalanche diode of claim 30, further comprising a shallow heavily doped implant of the second conductivity type in said shallower well implant.

32. The CMOS single photon avalanche diode of claim 31, wherein said shallow heavily doped implant forms an anode.

* * * * *

UNITED STATES PATENT AND TRADEMARK OFFICE
CERTIFICATE OF CORRECTION

| | | |
|---|---|---|
| PATENT NO. | : 8,217,436 B2 | Page 1 of 1 |
| APPLICATION NO. | : 12/498874 | |
| DATED | : July 10, 2012 | |
| INVENTOR(S) | : Robert K. Henderson et al. | |

It is certified that error appears in the above-identified patent and that said Letters Patent is hereby corrected as shown below:

In the Specification:

At column 5, line number 10, please replace [devices] with -- device, --.

At column 5, line number 46, please replace [Mm] with -- μm --.

At column 5, line number 66, please replace [tip] with -- up --.

Signed and Sealed this
Twenty-eighth Day of August, 2012

David J. Kappos
*Director of the United States Patent and Trademark Office*